United States Patent [19]

New

[11] Patent Number: 6,054,871

[45] Date of Patent: Apr. 25, 2000

[54] METHOD FOR SELF-RECONFIGURATION OF LOGIC IN A FIELD PROGRAMMABLE GATE ARRAY

[75] Inventor: Bernard J. New, Los Gatos, Calif.

[73] Assignee: Xilinx, Inc., San Jose, Calif.

[21] Appl. No.: 08/989,930

[22] Filed: Dec. 12, 1997

[51] Int. Cl.[7] .............................................. H03K 19/177
[52] U.S. Cl. ............................................... 326/39; 326/41
[58] Field of Search .......................................... 326/37–41

[56] References Cited

U.S. PATENT DOCUMENTS 5,600,263  2/1997  Trimberger et al. ....................... 326/39
5,787,007  7/1998  Bauer ........................................ 326/41

OTHER PUBLICATIONS

Xilinx The Programmable Logic Data Book, 1996, available from Xilinx, Inc., 2100 Logic Drive, San Jose, CA 954124, pp. 4–1 to 4–178.

*Primary Examiner*—Michael Tokar
*Assistant Examiner*—Don Phu Le
*Attorney, Agent, or Firm*—E. Eric Hoffman; Jeanette S. Harms

[57] ABSTRACT

A method for controlling the operation of an FPGA. Initially, a function generator of the FPGA is configured as a ROM look up table which holds a first set of data values. These data values are selectively routed to an output terminal of the function generator in response to a plurality of input signals which are provided to the function generator. The first set of data values is selected to define a first function implemented by the function generator. Subsequently, the function generator is reconfigured as a user RAM, thereby enabling a second set of data values to be written to the function generator. The function generator is then reconfigured as a ROM look up table which holds the second set of data values. These data values are selectively routed to the output terminal of the function generator in response to the input signals provided the function generator. The second set of data values is selected to define a second function implemented by the function generator. In the foregoing manner, the function generator is dynamically reconfigured to perform different functions during normal operation of the FPGA. The function generator is reconfigured in response to configuration data stored in a local memory, thereby enabling the reconfiguration to be performed in a relatively short time period. The ability to dynamically reconfigure the function generator such that the function generator performs different functions effectively enables an increased logic density with respect to conventional FPGAs.

10 Claims, 6 Drawing Sheets

METHOD FOR SELF-RECONFIGURATION OF LOGIC IN A FIELD PROGRAMMABLE GATE ARRAY

BACKGROUND OF THE INVENTION

1. Field of the Invention

The present invention relates to field programmable gate arrays (FPGAs) and methods for operating the same. More specifically, the present invention relates to a method for implementing logic functions within an FPGA by reconfiguring the FPGA.

2. Related Art

Conventional FPGAs include configurable logic blocks (CLBs) which are programmed to implement various logic functions. These logic functions are typically implemented using one or more programmable function generators within each CLB. These function generators can be programmed as read only memory (ROM) look up tables which provide output signals in response to a plurality of input signals. Each function generator can be programmed to provide an output signal which represents any function of the input signals. Thus, each function generator is capable of implementing a large number of functions. However, each function generator has a fixed number of input terminals and a fixed number of output terminals. The fixed number of input and output terminals necessarily limits the scope of the functions which can be performed by the function generator. For example, a function generator having four input terminals and one output terminal can implement a 2-to-1 multiplexer function by using two of the input terminals as input signal terminals and one of the input terminals as a control terminal. However, such a function generator has insufficient resources to implement more complex functions, such as a 3-to-1 multiplexer function or a 4-to-1 multiplexer function. Consequently, a plurality of function generators must be combined to implement these larger functions. However, the use of additional function generators undesirably increases the amount of FPGA resources required to perform a particular function.

It would therefore be desirable to have a method which expands the complexity of the functions which can be implemented by a function generator in an FPGA, thereby increasing the logic density of the FPGA.

SUMMARY OF THE INVENTION

Accordingly, the present invention provides a method for controlling the operation of an FPGA which includes the following steps. Initially, a function generator of the FPGA is configured as a ROM look up table which holds a first set of data values. One of these data values is selectively routed to an output terminal of the function generator as an output signal in response to a plurality of input signals which are provided to input terminals of the function generator. The first set of data values is selected to define a first function implemented by the function generator.

After the initial configuration of the function generator as a ROM look up table, the function generator is reconfigured as a user random access memory (RAM). The user RAM configuration enables data values to be written to the function generator. After the function generator has been reconfigured as a user RAM, a second set of data values is written to the function generator.

The function generator is subsequently reconfigured as a ROM look up table which holds the second set of data values. One of these data values is selectively routed to an output terminal of the function generator as an output signal in response to a plurality of input signals which are provided to input terminals of the function generator. The second set of data values is selected to define a second function implemented by the function generator.

In the foregoing manner, the function generator is dynamically reconfigured to perform different functions (i.e., the first and second functions) during normal operation of the FPGA. The function generator is reconfigured in response to configuration data stored in a local memory, thereby enabling the reconfiguration to be performed in a relatively short time period. The ability to dynamically reconfigure the function generator such that the function generator performs different functions effectively enables an increased logic density with respect to conventional FPGAs.

The present invention will be more fully understood in view of the following detailed description and drawings.

DETAILED DESCRIPTION

Figure 1:
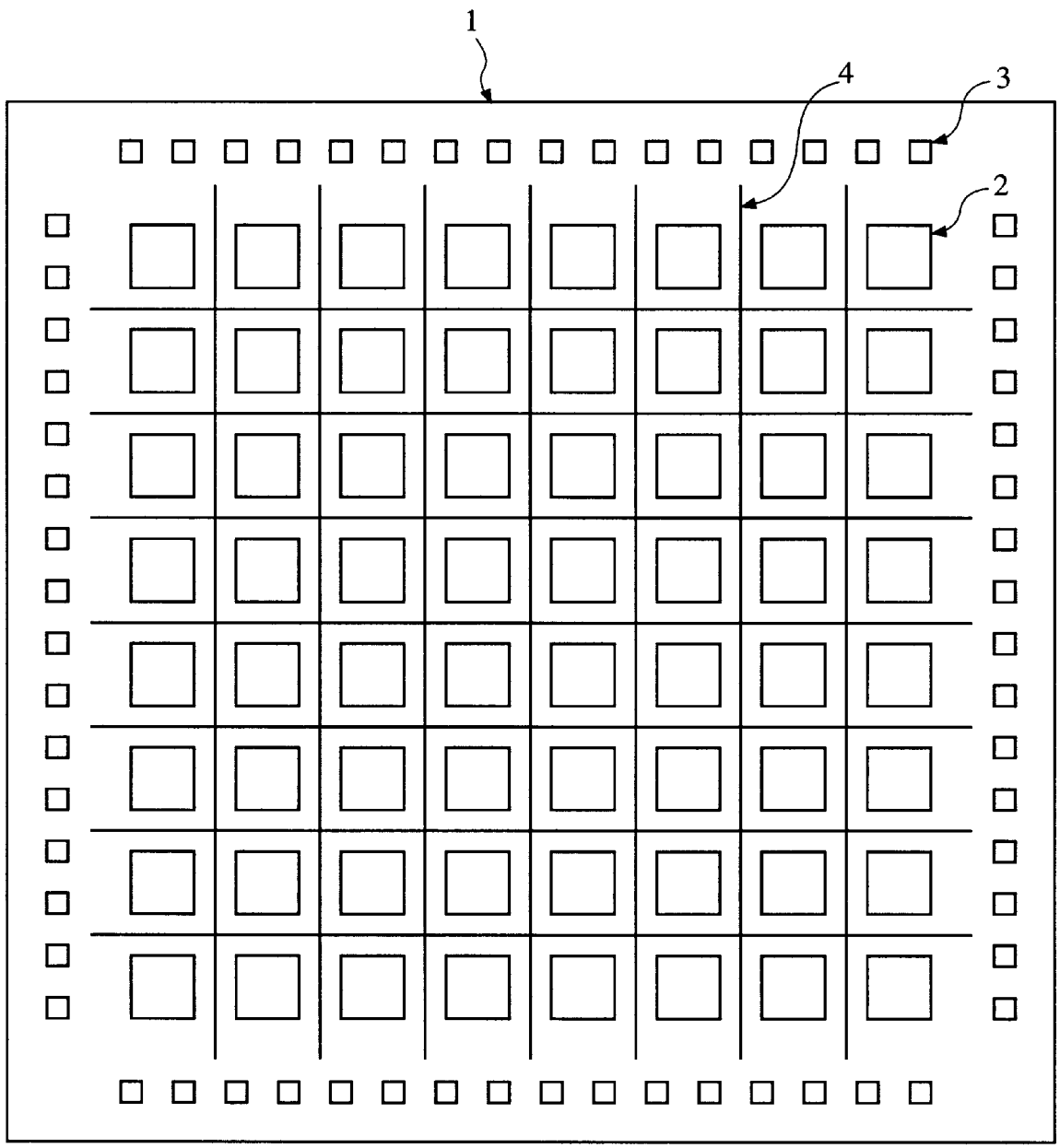
FIG. 1 is a block diagram of a conventional FPGA.

FIG. 1 is a block diagram of a conventional field programmable gate array (FPGA) 1 which includes a centrally located array 2 of configurable logic blocks (CLBs), a plurality of programmable input/output blocks (IOBs) 3 located around the perimeter of the FPGA 1, and programmable interconnect resources 4 which extend between the CLBs of the CLB array 2 and to the IOBs 3. FPGA 1 can be, for example, one of the XC4000 series of FPGAs provided by Xilinx, Inc., 2100 Logic Drive, San Jose, Calif. 95124. The XC4000 series of FPGAs are described in more detail in 'The Programmable Logic Data Book' pp. 4-1 to 4-178, published by Xilinx, Inc. in 1996, which is hereby incorporated by reference.

In general, the CLB array 2 provides the functional elements for constructing a logic circuit. The IOBs 3 provide an interface between the external pins of the FPGA 1 and the programmable interconnect resources 4. The programmable interconnect resources 4 provide routing paths to connect the CLBs 2 and IOBs 3 onto the desired networks. Customized configuration of the FPGA 1 is achieved by programming internal static memory cells (i.e., configuration memory cells) that determine the logic functions and interconnections of the CLBs 2, IOBs 3 and interconnect resources 4.

Figure 2:
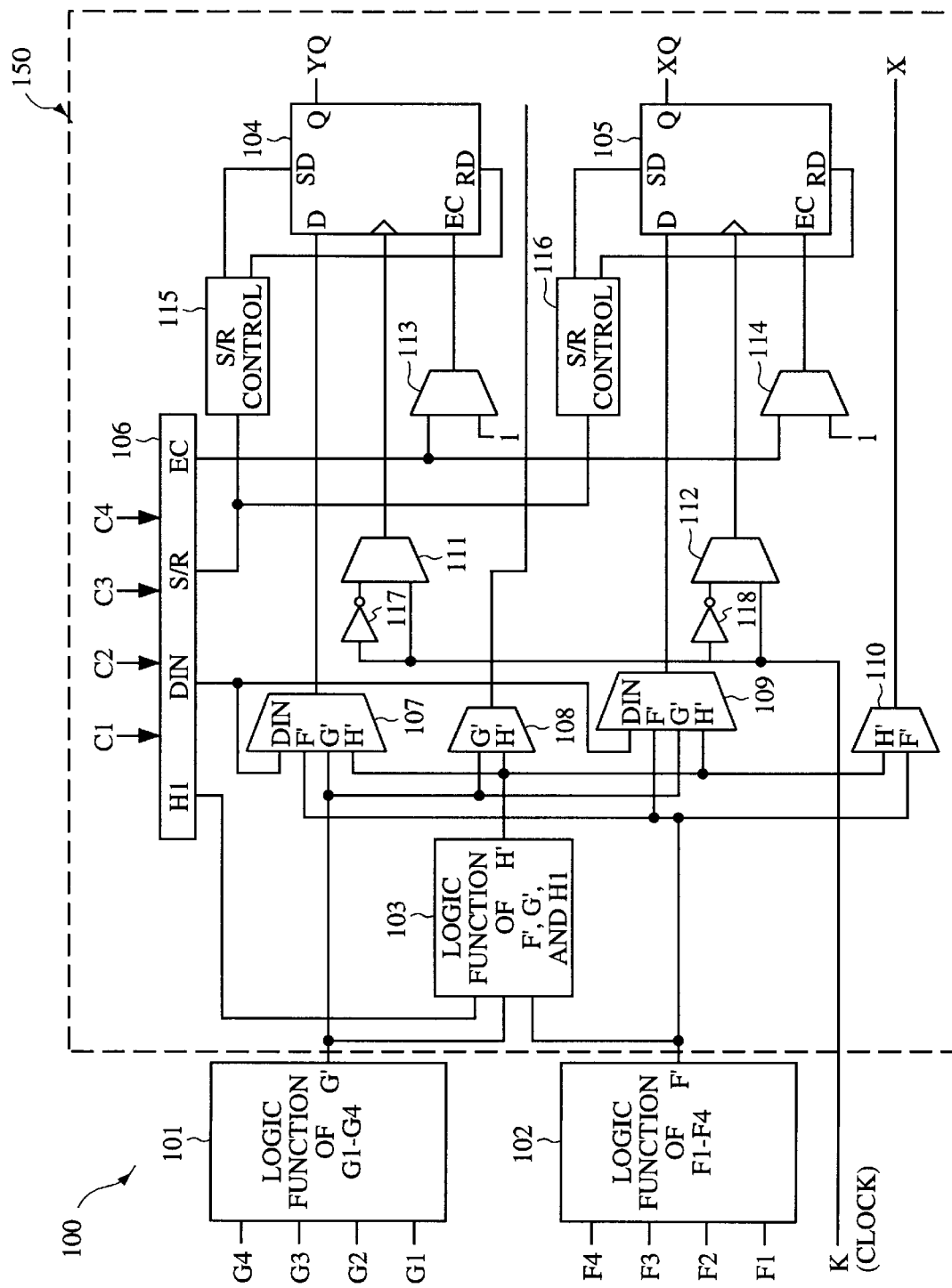
FIG. 2 is a block diagram of a conventional CLB which is configured in a ROM look up table configuration.

FIG. 2 is a block diagram of a conventional CLB 100 which is used in the XC4000 series of FPGAs provided by Xilinx, Inc. CLB 100 includes function generators 101–103, flip-flops 104–105, programmable switch 106, multiplexers 107–114, set/reset (S/R) control circuits 115–116 and inverters 117–118. Because the circuitry which includes function generator 103, flip-flops 104–105, programmable switch 106, multiplexers 107–114, set/reset (S/R) control circuits 115–116 and inverters 117–118 primarily control the routing of the output signals provided by function generators 101 and 102, this group of circuitry, along with the programmable interconnect resources associated with CLB 100, is hereinafter collectively referred to as the routing portion 150 of CLB 100.

CLB 100 includes thirteen input terminals (which receive the input signals labeled F1–F4, G1–G4, C1–C4 and K) and four output terminals (which provide the output signals labeled X, Y, XQ and YQ). These input and output terminals provide access to the function generators 101–103 and flip flops 104–105. These input and output terminals are further connected to programmable interconnect resources (not shown) located outside of the CLB 100.

In general, the CLB 100 operates as follows. Programmable switch 106 maps four control input signals C1–C4 into four internal control signals H1, DIN, S/R and EC in any arbitrary manner. Function generator 101 receives the four input signals G1–G4 and provides an output signal G'. Similarly, function generator 102 receives the four input signals F1–F4 and provides an output signal F'. Each of function generators 101–102 is capable of implementing any arbitrarily defined Boolean function of their four input signals. Function generator 103 receives input signals F', G' and H1, and in response, provides an output signal H' which can be any Boolean function of these three input signals. The F' or H' signal is routed through multiplexer 110 to the X output terminal. The G' or H' signal is routed through multiplexer 108 to the Y output terminal.

Flip flops 104 and 105 are edge-triggered D-type flip-flops which operate in response to a clock signal, a clock enable (EC) signal, a data signal D, a set (SD) signal and a reset (RD) signal. Each flip flop can be triggered on either the rising or falling clock edge as determined by inverters 117–118 and multiplexers 111–112. The set and reset signals are provided by S/R control circuits 115–116 in response to the internal S/R control signal. The flip flops are either enabled by the internal EC control signal, or continuously enabled, as determined by the settings of multiplexers 113–114. The data signals D provided to flip flops 104 and 105 are selected from the signals F', G', H' and control signal DIN as determined by the settings of multiplexers 107 and 109, respectively. Multiplexers 107–114 are set during the initial configuration of the CLB 100 by programming the appropriate configuration data values in associated configuration memory cells.

The CLB 100 can be programmed to implement any number of functions, either by itself, or in combination with other CLBs in the CLB array 2. Each four-input function generator can generate over 65,000 different functions. Consequently, the number of functions that can be performed by CLB 100 is very large.

Function generators 101 and 102 are typically configured to implement read only memory (ROM) look up tables. To accomplish this, the predetermined functions to be implemented by the function generators 101 and 102 are programmed by writing predetermined look-up table values to memory cells in each of the function generators 101 and 102 during the initial configuration of the FPGA 1. After this initial programming, each of the function generators 101 and 102 operates as a ROM look-up table which provides an output signal from one of the pre-programmed memory cells in response to the value of input signals (F1–F4 or G1–G4). Thus, after the initial programming, the ROM look up tables are treated as a read only memory (ROM) while the CLB 100 is operated as a logic device. When the function generators 101 and 102 are operated as ROM look-up tables, CLB 100 is said to be in a ROM look-up table configuration.

Certain FPGAs, such as the XC4000E, XC4000EX and XC4000XL families of devices available from Xilinx, Inc., also allow function generators 101 and 102 to be configured as a user-accessible random access memory (user RAM), such that data can be written to and read from the function generators 101 and 102 during normal logical operation of the FPGA. When the function generators 101 and 102 are operated as user RAM, CLB 100 is said to be in a user RAM configuration.

Figure 3:
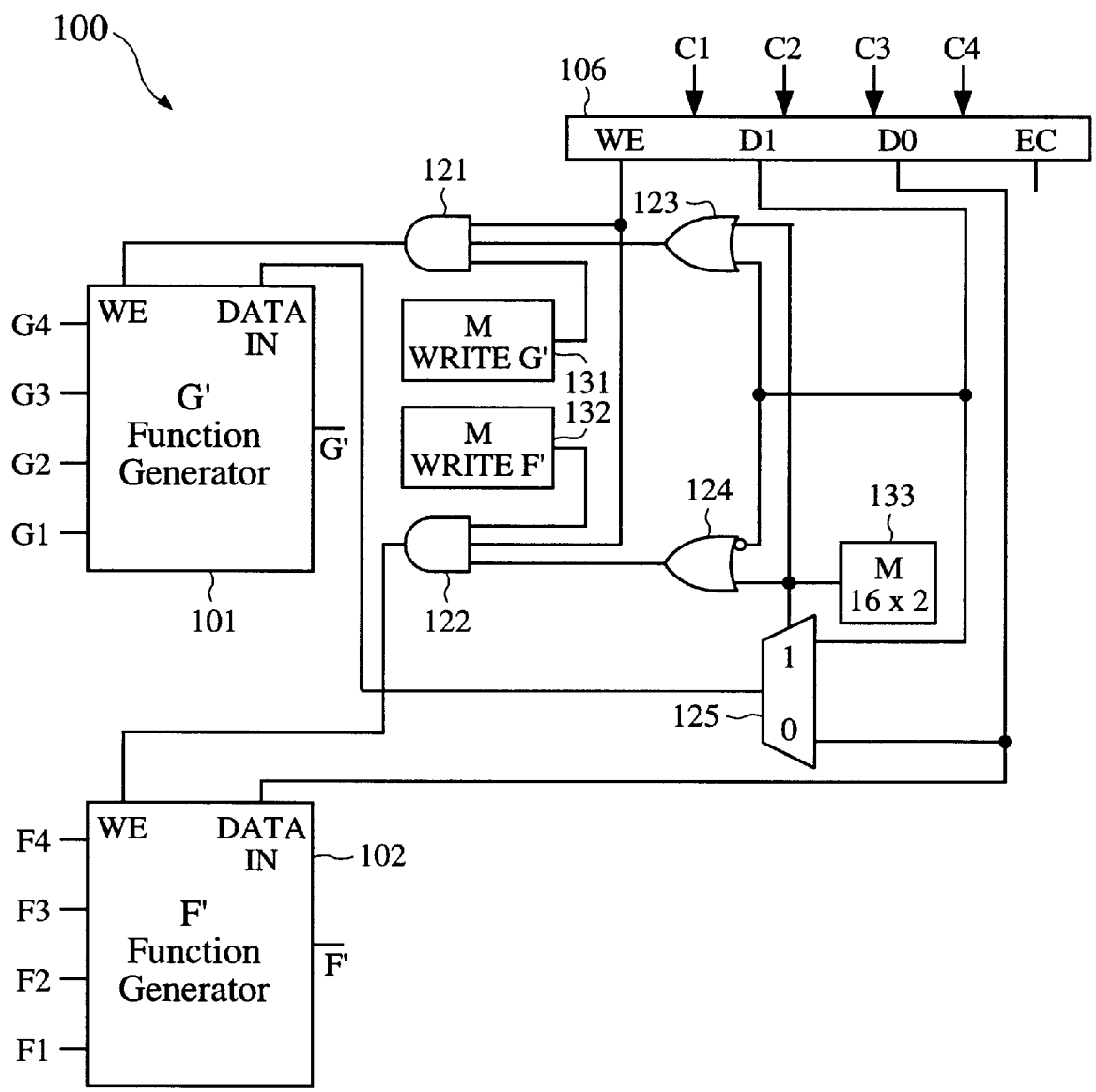
FIG. 3 is a block diagram of conventional circuitry for reconfiguring the CLB of FIG. 2 in a user RAM configuration.

FIG. 3 is a block diagram which illustrates the various circuit elements which are coupled to function generators 101 and 102 and programmable switch 106 to enable CLB 100 to operate as a user RAM. These various circuit elements include AND gates 121–122, OR gates 123–124, multiplexer 125 and configuration memory cells 131–133.

In general, the F1–F4 and G1–G4 input terminals of function generators 101 and 102 act as address lines to select particular memory cells in the function generators 101 and 102. The functionality of the control input signals C1–C4 are modified such that the H1, DIN and S/R lines become the write enable (WE) and data (D1, D0) lines for the user RAM. CLBs other than CLB 100, as well as the programmable interconnect resources, must be configured to provide the appropriate signals to the F1–F4, G1–G4 and C1–C4 input terminals.

Configuration memory cells 131–133 store data values which control the mode of operation of the user RAM. For example, if configuration memory cell 131 is programmed with a logic '0' value, then AND gate 121 provides a logic low write enable signal (WE), thereby disabling write operations to function generator 101. Similarly, if configuration memory cell 132 is programmed with a logic '0' value, then AND gate 122 provides a logic low write enable signal (WE), thereby disabling write operations to function generator 102. Configuration memory cells 131 and 132 are both programmed with logic '1' values when CLB 100 is in the user RAM configuration.

The value programmed in configuration memory cell 133 determines whether function generators 101 and 102 are operated as a 16×2 bit user RAM or as a single 32×1 bit user RAM. A logic '1' value programmed in configuration memory cell 133 enables operation as a 16×2 bit user RAM by routing data signal D1 to function generator 101, routing data signal D0 to function generator 102, and causing the write enable signal WE to be routed to both of function generators 101 and 102. A logic '0' value programmed in configuration memory cell 133 enables operation as a 32×1 bit user RAM by routing data signal D0 to both of function generators 101 and 102, and using the data signal D1 to route the write enable signal WE to either function generator 101 or function generator 102, but not both.

Figure 4:
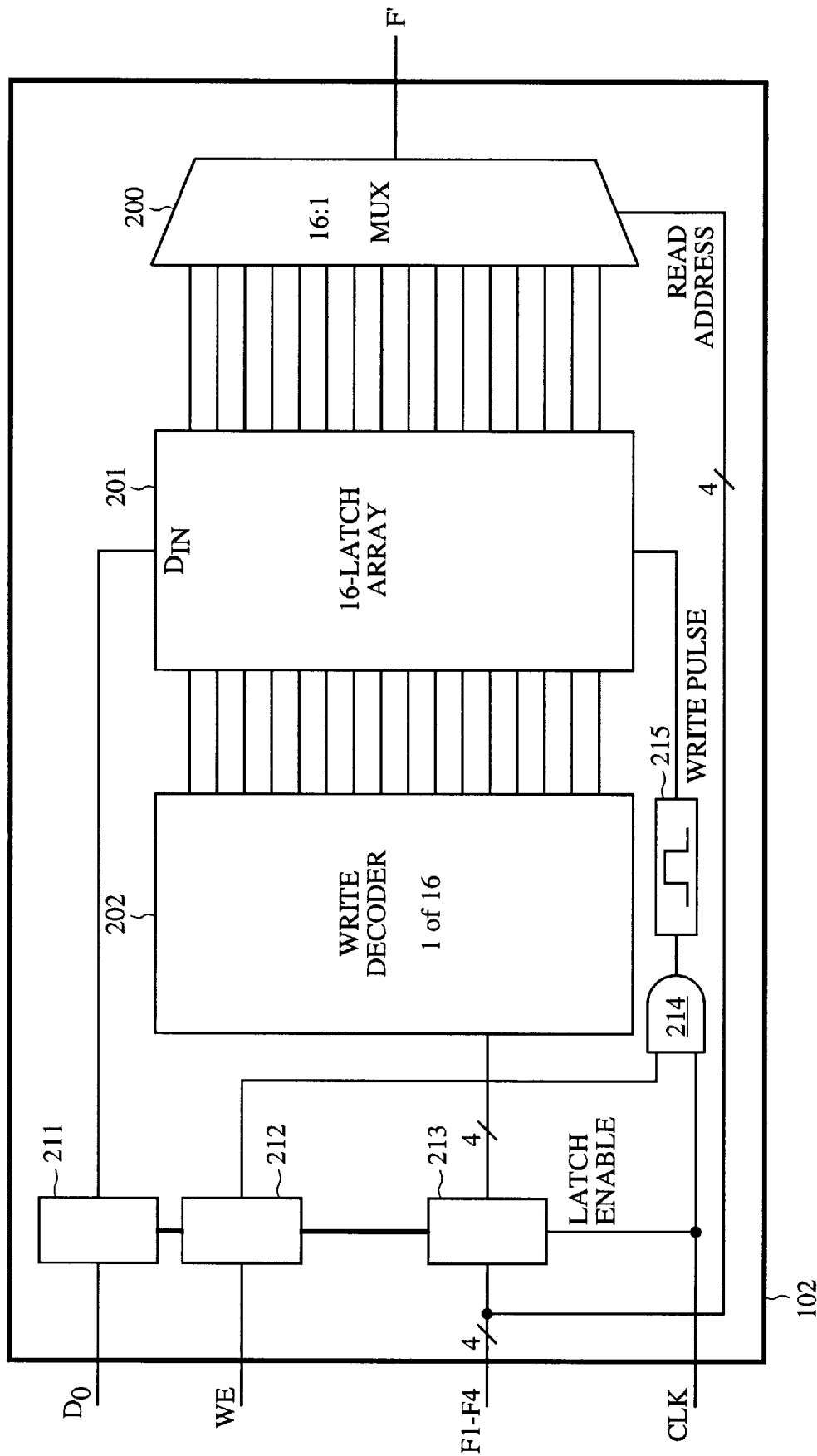
FIG. 4 is a block diagram of a conventional function generator.

FIG. 4 is a block diagram of function generator 102 (which is identical to function generator 101). Function generator 102 includes a 16-to-1 multiplexer 200, sixteen latch array 201, 1-of-16 write decoder 202, latches 211–213, AND gate 214 and write pulse generator 215. The function generator 102 illustrated in FIG. 4 is representative of the function generators implemented by the XC4000E family of FPGAs.

During operation as a user RAM, the sixteen latch array 201 can be written as follows. The rising edge of clock signal CLK (typically provided as the K input signal to CLB 100) is used to enable latches 211, 212 and 213 to latch in the D1, WE and F1–F4 signals, respectively. The F1–F4 signals stored in latch 213 are provided to write decoder 202. In response to the F1–F4 input signals, the write decoder 202 asserts a signal on one of its sixteen output lines, thereby selecting one of the sixteen latches within array 201. The D0 signal stored in latch 211 is provided to the sixteen latch array 201. The write enable (WE) signal stored in latch 212 is provided to an input terminal of AND gate 214. When the WE signal has a logic '1' value and the CLK signal has a logic '1' value (i.e., after a rising edge of the CLK signal), AND gate 214 provides a logic high signal to write pulse generator 215. In response to this logic high signal, write pulse generator 215 generates a write pulse signal which is provided to sixteen latch array 201. The write pulse signal enables the write circuitry within sixteen latch array 201, such that the data signal D0 is written to the latch selected by the write decoder 202.

Multiplexer 200 is coupled to receive each of the sixteen data values stored in sixteen latch array 201. Multiplexer 200 passes a selected one of these sixteen data values as the output signal F' in response to the four input signals F1–F4.

When function generator 102 is in the ROM look-up table configuration, write pulse generator 116 is disabled, thereby preventing data values from being written to the sixteen latch array 201. That is, the data values associated with the ROM look-up table configuration are held the sixteen latch array 201 during the initial device configuration. These data values then remain static during the logical operation of the FPGA. The multiplexer 200 provides one of the sixteen data values held in latch array 201 in response to the values of input signals F1–F4.

The same latch array 201 is therefore used to store the values for both the ROM look up table configuration and the user RAM configuration.

CLB 100 can be reconfigured in several different manners. Typically, CLB 100 is reconfigured by completely reconfiguring the associated FPGA in response to an externally provided (i.e., off-chip) stream of configuration data. Newer technology teaches that the configuration data for several configurations can be stored in a local memory within each CLB. This technology is described in commonly owned U.S. Pat. No. Ser. 5,600,263; in commonly owned co-filed U.S. patent application Ser. No. 08/989,746, entitled "Rapidly Reconfigurable FPGA Having A Multiple Region Architecture with Reconfiguration Caches Usable As Data", by Bernard J. New, Robert Anders Johnson, Ralph Wittig and Sundararajarao Mohan; in commonly owned co-filed U.S. patent application Ser. No. 08/989,980, entitled "Method and Apparatus for Controlling the Partial Reconfiguration of a Field Programmable Gate Array", by Bernard J. New, and in commonly owned co-filed U.S. patent application Ser. No. xx/xxx,xxx, entitled "Partially Reconfigurable FPGA and Method of Operating Same", by Bernard J. New and Charles R. Erickson, all of which are hereby incorporated by reference. Because the CLB is reconfigured by accessing locally stored configuration data, the reconfiguration of the CLB 100 is relatively fast (i.e., less than 250 nsec). Thus, the CLB 100 can be reconfigured between the ROM look up table configuration and the user RAM configuration in a relatively fast manner.

Figure 5:
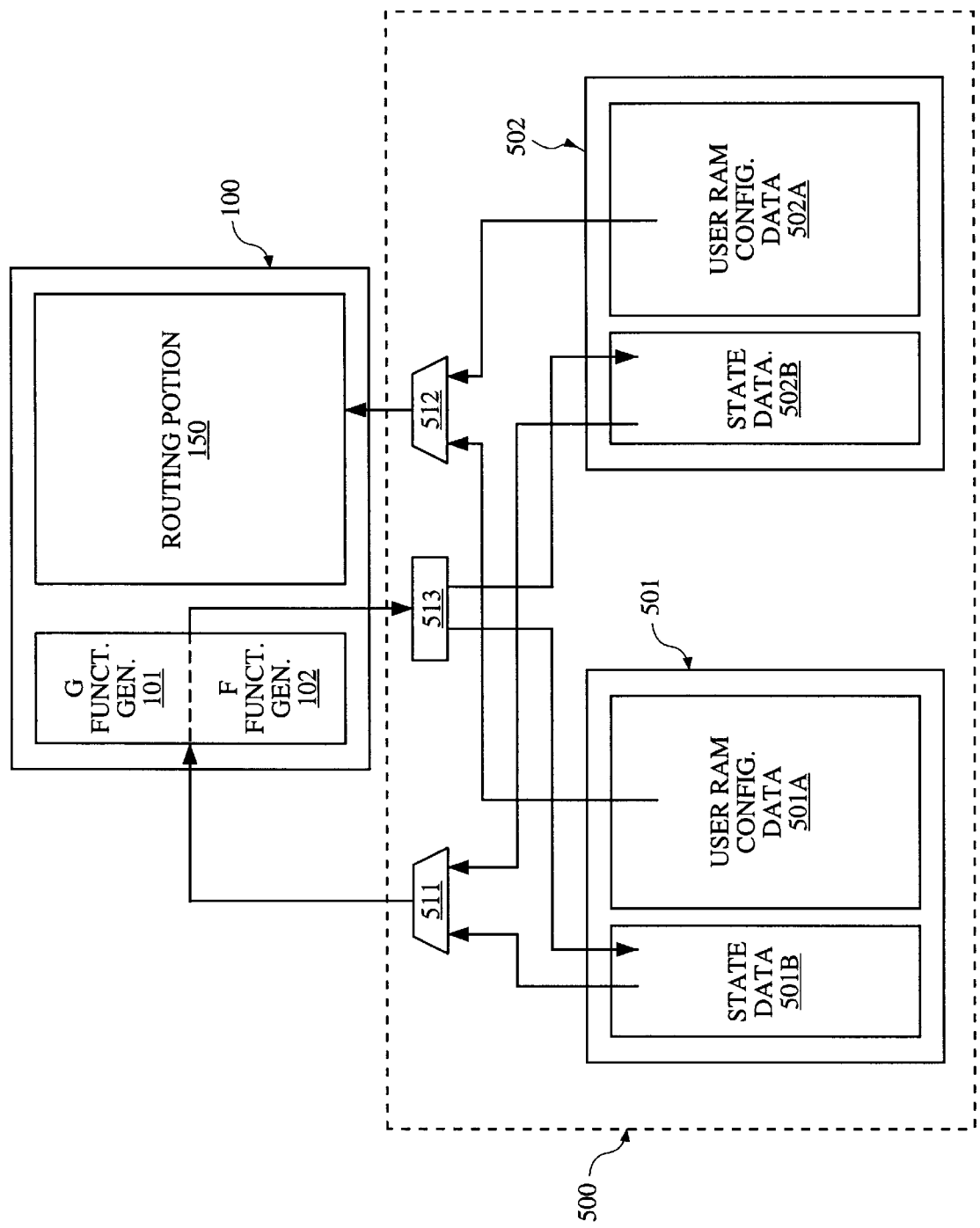
FIG. 5 is a block diagram of a CLB and an associated configuration memory in accordance with one embodiment of the invention.

FIG. 5 is a block diagram illustrating CLB 100 and an associated configuration memory 500. Configuration memory 500 includes at least two configuration memory blocks 501 and 502. Configuration memory block 501 stores all of the data required to configure CLB 100 (and the programmable interconnect resources associated with CLB 100) in a ROM look up table configuration. Configuration memory block 502 stores all of the data required to configure CLB 100 (and the programmable interconnect resources associated with CLB 100) in a user RAM configuration.

Configuration memory blocks 501 and 502 include configuration regions 501A and 502A, respectively. Each of the configuration regions 501A and 502A store data values required to program the routing portion 150 of CLB 100 (i.e., function generator 103, flip flops 104–105, programmable switch 106, multiplexers 107–114) as well as the programmable interconnect resources associated with CLB 100. In addition, each of configuration memory blocks 501 and 502 includes a state data region 501B and 502B, respectively, which stores the sixteen data values associated with function generator 101 and the sixteen data values associated with function generator 102. Configuration memory 500 also includes routing circuits 511, 512 and 513. As described in more detail below, routing circuit 511 is used to control the routing of state data from state data regions 501B and 502B to function generators 101 and 102. Similarly, routing circuit 512 is used to control the routing of configuration data from configuration data regions 501A and 502A to the routing portion 150 of CLB 100. Routing circuit 513 controls the routing of state data from function generators 101 and 102 to state data regions 501B or 502B.

Figure 6:
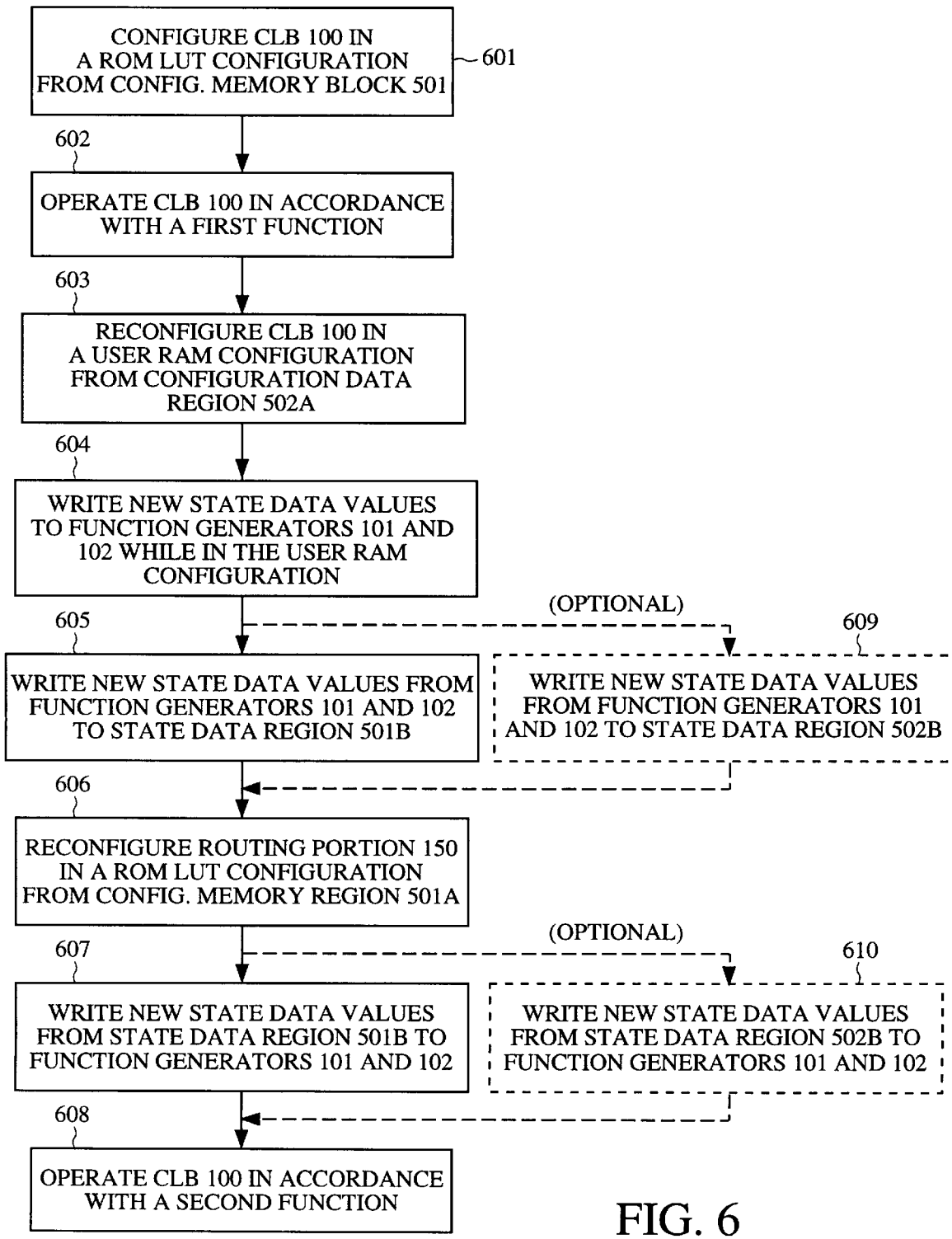
FIG. 6 is a flow chart which illustrates operating steps performed by a CLB and a configuration memory in accordance with one embodiment of the invention.

FIG. 6 is a flow chart which illustrates operating steps 601–610 performed by CLB 100 and configuration memory 500 in accordance with one embodiment of the invention.

In accordance with the present invention, CLB 100 is initially configured in a ROM look up table configuration using the configuration data stored in configuration memory block 501 (Step 601). That is, the data stored in configuration data region 501A and state data region 501B are initially routed through routing circuits 512 and 511, respectively, and used to configure routing portion 150 of CLB 100 and function generators 101–102, respectively. The state data region 501B includes a first set of look up table data values to be stored in the latch arrays of function generators 101 and 102.

After CLB 100 has been configured in response to the configuration data stored in configuration memory block 501, the CLB 100 operates as a ROM look up table having a first predetermined response to the input signals F1–F4 and G1–G4 (Step 602).

When it is desired to change the function of CLB 100, the configuration of CLB 100 is cleared, and the configuration data stored in configuration memory region 502A of configuration memory block 502 is routed through routing circuit 512 and used to configure routing portion 150 of CLB 100 in a user RAM configuration (Step 603). Once routing portion 150 is configured to operate as user RAM, a second set of data values is written to the latch arrays of function generators 101 and 102 in the manner previously described in connection with FIGS. 3 and 4 (Step 604).

The second set of data values written to function generators 101 and 102 during Step 604 is subsequently routed through routing circuit 513 and stored in state data region 501B of configuration memory block 501 (Step 605).

Next, the configuration of CLB 100 is again cleared, and routing circuit 512 is controlled to route the configuration data stored in configuration memory region 501A of configuration memory block 501 to reconfigure routing portion 150 of CLB 100 into the ROM look up table configuration (Step 606). Routing circuit 511 is controlled to route the second set of data values which was previously written to state data region 501B (while CLB 100 was configured as a user RAM) to function generators 101–102 (Step 607). After CLB 100 has been reconfigured in this manner, the CLB 100 operates as a ROM look up table having a second predetermined response to the input signals F1–F4 and G1–G4 (Step 608). Thus, data written to CLB 100 in the user RAM configuration defines the logic operation of the CLB 100 in a subsequent ROM look up table configuration.

In an alternate embodiment, the second set of data values written to function generators 101 and 102 during Step 604 is routed through routing circuit 513 to state data region 502B (instead of state data region 501B). The second set of data values is then written to state data region 502B (Step 609). Processing then returns to Step 606, where the routing portion 150 of CLB 100 is reconfigured in the ROM look up table configuration in response to the data values stored in configuration memory region 501A. However, processing then branches to Step 610, where the second set of data values stored in state data region 502B is routed through routing circuit 511 and are written to function generators 101 and 102.

In yet another embodiment, the configuration of CLB 100 is not cleared after the new state data values are written to function generators 101 and 102 during Step 604. In this embodiment, Steps 605 and 607 (as well as optional Steps 609 and 610) are not performed. The routing portion 150 is reconfigured during Step 606 as previously described, with the new state data values remaining in function generators 101 and 102 during this step.

In the foregoing manner, the ROM look up table configuration can be dynamically modified in a relatively fast manner during normal operation of the FPGA. This ability enables a method for self-reconfiguring logic. Such self-reconfiguring logic can be useful when the logic implemented by the function generators 101 and 102 must be changed only occasionally.

For example, assume that a 4-to-1 multiplexer is to be implemented, and that the control input signals to this multiplexer will not change states often. Table 1 sets forth the truth table for a 4-to-1 multiplexer function which includes four input signals INPUT_0, INPUT_1, INPUT_2 and INPUT_3 which are routed to a single output terminal in response to two control signals C1 and C0.

TABLE 1

| C1 | C0 | OUTPUT SIGNAL |
|----|----|---------------|
| 0  | 0  | INPUT_0       |
| 0  | 1  | INPUT_1       |
| 1  | 0  | INPUT_2       |
| 1  | 1  | INPUT_3       |

In a conventional FPGA, such a 4-to-1 multiplexer is implemented by programming function generators 101, 102 and 103 as 2-to-1 multiplexers, with the output signals of function generators 101 and 102 being provided to the input terminals of function generator 103. A single function generator (e.g., function generator 102), which includes four input terminals and one output terminal, is typically incapable of implementing a 4-to-1 multiplexer, which requires four data input terminals, two control terminals and one data output terminal. However, in accordance with the present invention, a 4-to-1 multiplexer can be implemented using a single function generator 102 as follows.

In accordance with the present invention, the sixteen latch array 201 of function generator 102 is programmed in accordance with Table 2 when the 4-to-1 multiplexer is to provide input signal F1 as an output signal. The 'X' symbol in Table 2 (as well as Tables 3–5 below) indicates a 'don't care' value.

TABLE 2

| F4 | F3 | F2 | F1 | F' |
|----|----|----|----|----|
| X  | X  | X  | 0  | 0  |
| X  | X  | X  | 1  | 1  |

Thus, the output of function generator 102 will always be equal to input signal F1 when the function generator 102 is programmed as defined by Table 2, independent of the values of input signals F2, F3 and F4.

If the function generator 102 is to provide input signal F2 as an output signal, then function generator 102 is reconfigured to implement the ROM look up table as defined below in Table 3.

TABLE 3

| F4 | F3 | F2 | F1 | F' |
|----|----|----|----|----|
| X  | X  | 0  | X  | 0  |
| X  | X  | 1  | X  | 1  |

Thus, the output of function generator 102 will always be equal to input signal F2 when the function generator 102 is programmed as defined by Table 3, independent of the values of input signals F1, F3 and F4.

If the function generator is to provide input signal F3 as an output signal, then function generator 102 is reconfigured to implement the ROM look up table as defined below in Table 4.

TABLE 4

| F4 | F3 | F2 | F1 | F' |
|----|----|----|----|----|
| X  | 0  | X  | X  | 0  |
| X  | 1  | X  | X  | 1  |

Thus, the output of function generator 102 will always be equal to input signal F3 when the function generator 102 is programmed as defined by Table 4, independent of the values of input signals F1, F2 and F4.

If the function generator is to provide input signal F4 as an output signal, then function generator 102 is reconfigured to implement the ROM look up table as defined below in Table 5.

TABLE 5

| F4 | F3 | F2 | F1 | F' |
|----|----|----|----|----|
| 0  | X  | X  | X  | 0  |
| 1  | X  | X  | X  | 1  |

Thus, the output of function generator 102 will always be equal to input signal F4 when the function generator 102 is programmed as defined by Table 5, independent of the values of input signals F1, F2 and F3.

The reprogramming of function generators 101–102 is controlled by circuitry (not shown) located outside of CLB 100, typically by other CLBs of the FPGA. This circuitry determines when the function generators 101–102 are to provide different output functions and then initiates the reprogramming. The reprogramming of function generators 101–102 is performed as previously described. That is, the function generators are reconfigured from the ROM look up table configuration to the user RAM configuration, data values representative of the new function are written to the latches of the user RAM, and the function generators are reconfigured from the user RAM configuration to the ROM look up table configuration, thereby loading the data values representative of the new function in the ROM look up table. In the foregoing manner, function generators 101–102 are able to implement more complex logic functions. The cost of implementing these more complex logic functions is the additional time required to reconfigure the function generators 101–102 each time the function generators 101–102 are to perform different functions. Although the present invention has been described in connection with the implementation of a 4-to-1 multiplexer, it is understood that other logic functions can be implemented by function generators 101–102 in accordance with the principles of the present invention. For example, logic functions, such as multiplication by a constant which must be modified occasionally, can be implemented by reconfiguring the function generators in the various CLBs.

When making changes to the configuration of an FPGA, one must be careful to conform with all design rules. Errors occurring during the reconfiguration of the programmable interconnect resources of the FPGA may result in more than one driver being coupled to the same interconnect resource. Such an error can cause excessive current to be drawn, thereby overheating and possibly destroying the FPGA. The present invention advantageously minimizes the possibility of this occurrence by limiting the reconfiguration changes to function generators 101 and 102. Changing the values stored by the function generators is a benign change which cannot result in a violation of the design rules of the FPGA.

Although the invention has been described in connection with several embodiments, it is understood that this invention is not limited to the embodiments disclosed, but is capable of various modifications which would be apparent to one of ordinary skill in the art. Thus, the invention is limited only by the following claims.

I claim:

1. A method of operating a field programmable gate array (FPGA), the method comprising the steps of:

loading a first set of configuration data and a second set of configuration data into a local memory of the FPGA, wherein the local memory simultaneously stores the first and second sets of configuration data;

configuring a function generator of the FPGA as a read only memory (ROM) look up table in response to the first set of configuration data, wherein the function generator provides an output signal which is a predetermined first function of a plurality of input signals, the first function being defined by a first set of state data values stored in the function generator;

reconfiguring the function generator as a writable user RAM in response to the second set of configuration data;

writing a second set of state data values to the function generator; and then reconfiguring the function generator as a ROM look up table in response to the first set of configuration data, wherein the ROM look up table provides an output signal which is a predetermined second function of the plurality of input signals, the second function being defined by the second set of state data values.

2. The method of claim 1, further comprising the step of clearing the function generator prior to reconfiguring the function generator as a writable user RAM.

3. The method of claim 1, further comprising the step of storing the first and second sets of state data values in the local memory on the FPGA.

4. The method of claim 1, wherein the steps of reconfiguring and writing are performed during normal operation of the FPGA.

5. The method of claim 1, wherein the first function comprises causing the output signal to be equal to a first selected one of the input signals.

6. The method of claim 5, wherein the second function comprises causing the output signal to be equal to a second selected one of the input signals.

7. A method of operating a field programmable gate array (FPGA), the method comprising the steps of:

loading a first set of configuration data and a second set of configuration data into a local memory of the FPGA, wherein the local memory simultaneously stores the first and second sets of configuration data;

configuring a function generator of the FPGA as a read only memory which stores a first set of state data values in response to the first set of configuration data, wherein the function generator routes a selected one of the data values from the first set of state data values in response to a plurality of input signals, the first set of state data values thereby defining a first function of the function generator;

reconfiguring the function generator as a writable random access memory in response to the second set of configuration data;

writing a second set of state data values to the function generator; and then reconfiguring the function generator as a read only memory which stores the second set of state data values in response to the first set of configuration data, wherein the function generator routes a selected one of the data values from the second set of state data values in response to the plurality of input signals, the second set of state data values thereby defining a second function of the function generator.

8. The method of claim 1, wherein the first function combines with the second function to implement at least a portion of a third function that can not be implemented by a single configuration of the function generator.

9. The method of claim 1, wherein the step of reconfiguring the function generator as a writable random access memory takes less than 250 nano-seconds.

10. The method of claim 2, further comprising the step of clearing the function generator prior to reconfiguring the function generator as a ROM look up table.

* * * * *